(12) United States Patent
Cheng et al.

(10) Patent No.: US 9,793,405 B2
(45) Date of Patent: Oct. 17, 2017

(54) SEMICONDUCTOR LATERAL SIDEWALL GROWTH FROM A SEMICONDUCTOR PILLAR

(71) Applicant: International Business Machines Corporation, Armonk, NY (US)

(72) Inventors: Cheng-Wei Cheng, White Plains, NY (US); Sanghoon Lee, Mohegan Lake, NY (US); Effendi Leobandung, Stormville, NY (US); Renee T. Mo, Yorktown Heights, NY (US); Yanning Sun, Scarsdale, NY (US)

(73) Assignee: International Business Machines Corporation, Armonk, NY (US)

(*) Notice: Subject to any disclaimer, the term of this patent is extended or adjusted under 35 U.S.C. 154(b) by 21 days.

(21) Appl. No.: 15/074,600

(22) Filed: Mar. 18, 2016

(65) Prior Publication Data
US 2017/0271500 A1    Sep. 21, 2017

(51) Int. Cl.
| | |
|---|---|
| H01L 27/12 | (2006.01) |
| H01L 29/78 | (2006.01) |
| H01L 29/06 | (2006.01) |
| H01L 29/786 | (2006.01) |
| H01L 29/66 | (2006.01) |

(52) U.S. Cl.
CPC ........ *H01L 29/785* (2013.01); *H01L 29/0649* (2013.01); *H01L 29/0676* (2013.01); *H01L 29/66795* (2013.01); *H01L 29/78681* (2013.01); *H01L 29/78696* (2013.01)

(58) Field of Classification Search
CPC .................................................... H01L 29/785
See application file for complete search history.

(56) References Cited

U.S. PATENT DOCUMENTS 9,362,177 B1 * 6/2016 Haensch ......... H01L 21/823487
9,472,471 B1 * 10/2016 Balakrishnan ........ H01L 21/845

* cited by examiner

*Primary Examiner* — Marc Armand
*Assistant Examiner* — Sarah Salerno
(74) *Attorney, Agent, or Firm* — Scully, Scott, Murphy & Presser, P.C.; Louis J. Percello, Esq

(57) ABSTRACT

A method is provided that may include providing a plurality of semiconductor pillars extending from a surface of a substrate, wherein a spacer is present on sidewall surfaces of each semiconductor pillar. A seed hole is then formed in a portion of each spacer that exposes a portion of at least one sidewall surface of each semiconductor pillar. Next, a semiconductor nanowire is epitaxially grown from the exposed portion of the at least one sidewall surface of each semiconductor pillar and entirely through each seed hole. A gate structure is then formed straddling over a channel portion of each semiconductor nanowire.

20 Claims, 15 Drawing Sheets

SEMICONDUCTOR LATERAL SIDEWALL GROWTH FROM A SEMICONDUCTOR PILLAR

BACKGROUND

The present application relates to a semiconductor structure and a method of forming a semiconductor structure. More particularly, the present application relates to a method of forming a semiconductor nanowire laterally from a portion of a sidewall of a semiconductor pillar.

For more than three decades, the continued miniaturization of metal oxide semiconductor field effect transistors (MOSFETs) has driven the worldwide semiconductor industry. Various showstoppers to continued scaling have been predicated for decades, but a history of innovation has sustained Moore's Law in spite of many challenges. However, there are growing signs today that metal oxide semiconductor transistors are beginning to reach their traditional scaling limits. Since it has become increasingly difficult to improve MOSFETs and therefore complementary metal oxide semiconductor (CMOS) performance through continued scaling, further methods for improving performance in addition to scaling have become critical.

The use of non-planar semiconductor devices such as, for example, semiconductor nanowire field effect transistors is the next step in the evolution of complementary metal oxide semiconductor (CMOS) devices. In its basic form, semiconductor nanowire field effect transistors include at least one semiconductor nanowire including a source region, a drain region and a channel region located between the source region and the drain region, and a gate electrode that is formed straddling over the channel region of the at least one semiconductor nanowire. A gate dielectric is typically disposed between the channel region of the at least one semiconductor nanowire and the gate electrode. The gate electrode regulates electron flow through the semiconductor nanowire channel between the source region and the drain region.

Semiconductor nanowire field effect transistors can achieve higher drive currents with increasingly smaller dimensions as compared to conventional planar FETs. One problem associated with conventional semiconductor nanowire field effect transistors that include high mobility channel materials such as, a III-V compound semiconductor, is that the semiconductor nanowire that is grown typically has defects associated therewith which hinder the performance of the device.

SUMMARY

One aspect of the present application relates to a method of forming a semiconductor structure. In one embodiment of the present application, the method may include providing a plurality of semiconductor pillars extending from a surface of a substrate, wherein a spacer is present on sidewall surfaces of each semiconductor pillar. A seed hole is then formed in a portion of each spacer that exposes a portion of at least one sidewall surface of each semiconductor pillar. Next, a semiconductor nanowire is epitaxially grown from the exposed portion of the at least one sidewall surface of each semiconductor pillar and entirely through each seed hole. A gate structure is then formed straddling over a channel portion of each semiconductor nanowire.

Another aspect of the present application relates to a semiconductor structure. In one embodiment of the present application, the semiconductor structure may include a plurality of semiconductor nanowires oriented parallel to each other, wherein one end of each of the semiconductor nanowires is present in a seed hole provided in a first spacer, and another end of each of the semiconductor nanowires contacts a sidewall surface of a second spacer. The structure of the present application further includes a functional gate structure oriented perpendicular to and straddling over a channel portion of each of the semiconductor nanowires.

DETAILED DESCRIPTION

Figure 1A:
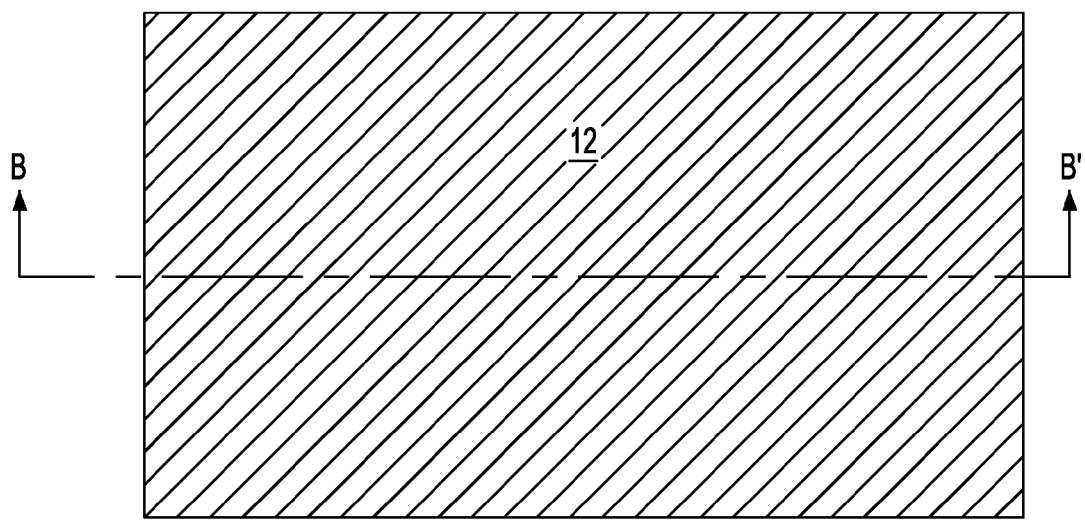
FIG. 1A is a top down view of an exemplary semiconductor structure including, from bottom to top, a semiconductor material layer and a hard mask layer that can be employed in accordance with an embodiment of the present application.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

Figure 1B:
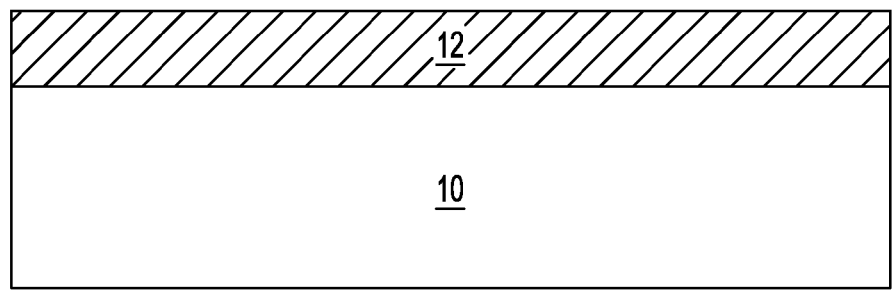
FIG. 1B is a cross sectional view of the exemplary semiconductor structure of FIG. 1A along vertical plane B-B'.

Referring first to FIGS. 1A-1B, there are illustrated various views of an exemplary semiconductor structure including, from bottom to top, a semiconductor material layer 10 and a hard mask layer 12 that can be employed in accordance with an embodiment of the present application.

The semiconductor material layer 10 that can be employed in the present application includes any semiconductor material having semiconducting properties. Examples of semiconductor materials that can be employed as the semiconductor material layer 10 include, but are not limited to, silicon (Si), germanium (Ge), silicon germanium alloys (SiGe), silicon carbide (SiC), silicon germanium carbide (SiGeC), III-V compound semiconductors and/or II-VI compound semiconductors. III-V compound semiconductors are materials that include at least one element from Group III of the Periodic Table of Elements and at least one element from Group V of the Periodic Table of Elements. II-VI compound semiconductors are materials that include at least one element from Group II of the Periodic Table of Elements and at least one element from Group VI of the Periodic Table of Elements.

The semiconductor material layer 10 that can be employed in the present application is typically a single crystalline semiconductor material such as, for example, single crystalline silicon. The semiconductor material layer 10 may have any of the well known crystal orientations. For example, the crystal orientation of the semiconductor material layer 10 may be {100}, {110}, or {111}. Other crystallographic orientations besides those specifically mentioned can also be used in the present application.

In one embodiment of the present application, the semiconductor material layer 10 may represents an entirety of a bulk semiconductor substrate. In another embodiment of the present application, the semiconductor material layer 10 may represent a topmost semiconductor material of a stack of various semiconductor materials. In yet another embodiment of the present application, the semiconductor material layer 10 may represent a topmost semiconductor layer of a semiconductor-on-insulator (SOI) substrate. In such an embodiment (not specially shown), an insulator layer and, optionally, a handle substrate, may be located beneath the semiconductor material layer 10.

When present, the handle substrate may include one of the semiconductor materials mentioned above for the semiconductor material layer 10. In some embodiments, the handle substrate may include a same semiconductor material as the semiconductor material layer 10. In other embodiments, the handle substrate may include a semiconductor material that is different in terms of composition from the semiconductor material that provides the semiconductor material layer 10. When the handle substrate is a semiconductor material, the semiconductor material may be single crystalline, polycrystalline or amorphous. When the handle substrate is a semiconductor material, the semiconductor material that provides the handle substrate may have any of the above mentioned crystal orientations. In another embodiment of the present application, the handle substrate of the SOI may be composed of a non-semiconductor material including, for example, a dielectric material and/or a conductive material.

The insulator layer of the SOI substrate may be a crystalline or non-crystalline dielectric material such as an oxide and/or nitride. In one embodiment, the insulator layer of the SOI substrate is a dielectric oxide such as, for example, silicon dioxide. In another embodiment of the present application, the insulator layer of the SOI substrate may be a dielectric nitride such as, for example, silicon nitride or boron nitride. In yet another embodiment of the present application, the insulator layer of SOI substrate may include a stack of a dielectric oxide and a dielectric nitride. In one example, a stack of, in any order, silicon dioxide and silicon nitride or boron nitride may be employed as the insulator layer of the SOI substrate. The insulator layer of the SOI substrate may have a thickness from 10 nm to 200 nm, although other thicknesses that are lesser than, or greater than, the aforementioned thickness range may also be employed as the thickness of the insulator layer of the SOI substrate.

In some embodiments of the present application and for a SOI wafer, the semiconductor material layer 10 may have a thickness from 10 nm to 200 nm. In other embodiments of the present application and for a bulk substrate, the semiconductor material layer 10 may have a thickness from 100 μm to 1000 μm. Other thicknesses that are lesser than, or greater than, the aforementioned thickness ranges may also be employed as the thickness of the semiconductor material layer 10.

The hard mask layer 12 is a contiguous layer that covers the entirety of the semiconductor material layer 10. The hard mask layer 12 that is employed in the present application may include any hard mask material such as, for example, a dielectric oxide, a dielectric nitride and/or a dielectric oxynitride. In one embodiment, the hard mask material that can be used in providing the hard mask layer 12 can be composed of silicon dioxide. In another embodiment, the hard mask material that can be used in providing the hard mask layer 12 can be composed of silicon nitride. In yet another embodiment, the hard mask material that can be used in providing the hard mask layer 12 can be a stack composed of, in any order, silicon dioxide and silicon nitride.

In some embodiments, the hard mask material that can be used in providing the hard mask layer 12 can be formed by a deposition process such as, for example, chemical vapor deposition (CVD) or plasma enhanced chemical vapor deposition (PECVD). In other embodiments, the hard mask material that can be used in providing the hard mask layer 12 can be formed by a thermal process such as, for example, thermal oxidation and/or thermal nitridation. In yet other embodiments, the hard mask material that can be used in providing the hard mask layer 12 can be formed by a combination of a deposition process and a thermal process. The thickness of the hard mask layer 12 can range from 10 nm to 40 nm. Other thicknesses that are lesser than, or greater than, the aforementioned thickness range may also be employed as the thickness of the hard mask layer 12.

Figure 2A:
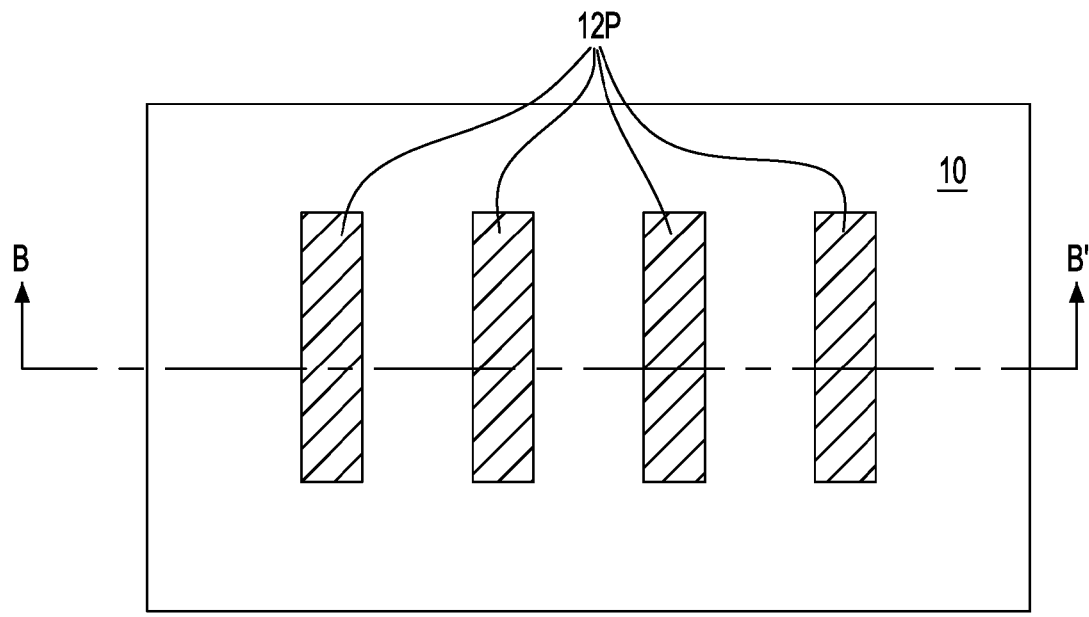
FIG. 2A is a top down view of the exemplary semiconductor structure of FIGS. 1A-1B after patterning the hard mask layer.
Figure 2B:
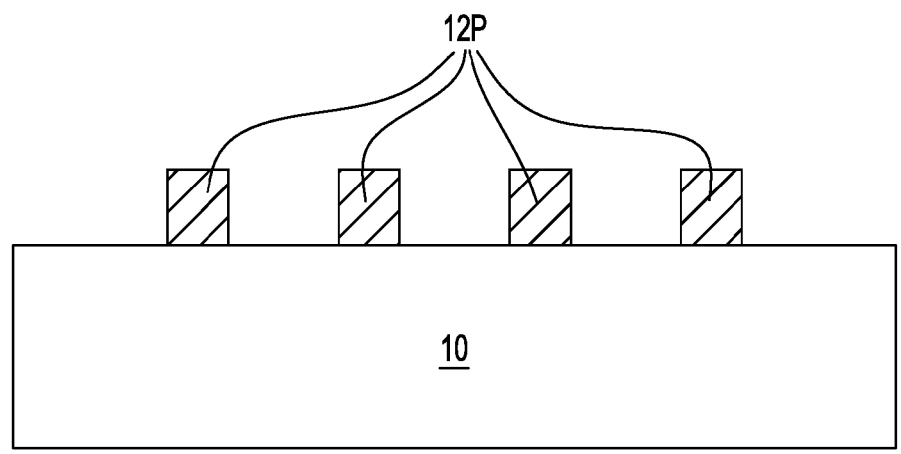
FIG. 2B is a cross sectional view of the exemplary semiconductor structure of FIG. 2A along vertical plane B-B'.

Referring now to FIGS. 2A-2B, there are illustrated various views of the exemplary semiconductor structure of FIGS. 1A-1B after patterning the hard mask layer 12. After patterning, and as shown in FIGS. 2A-2B, a portion of the hard mask layer 12 remains on the surface of the semiconductor material layer 10. Each remaining portion of the hard mask layer 12 may be referred to herein as a hard mask portion 12P.

The patterning process used to define the exemplary semiconductor structure shown in FIGS. 2A-2B may include lithography and etching. Lithography includes forming a photoresist material (not shown) atop a material or material stack to be patterned. The photoresist material may include a positive-tone photoresist composition, a negative-tone photoresist composition or a hybrid-tone photoresist composition. The photoresist material may be formed by a deposition process such as, for example, spin-on coating. After forming the photoresist material, the deposited photoresist material is subjected to a pattern of irradiation. Next, the exposed photoresist material is developed utilizing a conventional resist developer. This provides a patterned photoresist atop a portion of the material or material stack to be patterned. The pattern provided by the patterned photoresist material is thereafter transferred into the underlying material layer or material layers utilizing at least one pattern transfer etching process. Typically, the at least one pattern transfer etching process is an anisotropic etch. In one embodiment, a dry etching process such as, for example, reactive ion etching can be used. In another embodiment, a chemical etchant can be used. In still a further embodiment, a combination of dry etching and wet etching can be used. After etching, the patterned photoresist can be removed utilizing any photoresist stripping process such as, for example, ashing. In some embodiments, the patterned photoresist may remain atop each hard mask portion 12P during the subsequent patterning of the semiconductor material layer 10. After patterning the semiconductor material layer 10 and, if not previously removed, the patterned photoresist may then be removed as defined above.

In another embodiment, the patterning process used to define the exemplary semiconductor structure shown in FIGS. 2A-2B may include a sidewall image transfer (SIT) process. In yet another embodiment, the patterning process used to define the exemplary semiconductor structure shown in FIGS. 2A-2B may include a direct self-assembly (DSA) patterning process.

Each hard mask portion 12P that is formed can have a width, as measured from one sidewall to an opposing sidewall, of from 15 nm to 60 nm. Other widths are possible and can be employed in the present application for the width of each hard mask portion 12P. Each hard mask portion 12P has sidewall surfaces that are substantially perpendicular to the topmost horizontal surface of the semiconductor material layer 10. By "substantially perpendicular" it is meant that the sidewall surfaces of each hard mask portion 12P is 90°±3° relative to the topmost horizontal surface of the semiconductor material layer 10.

Figure 3A:
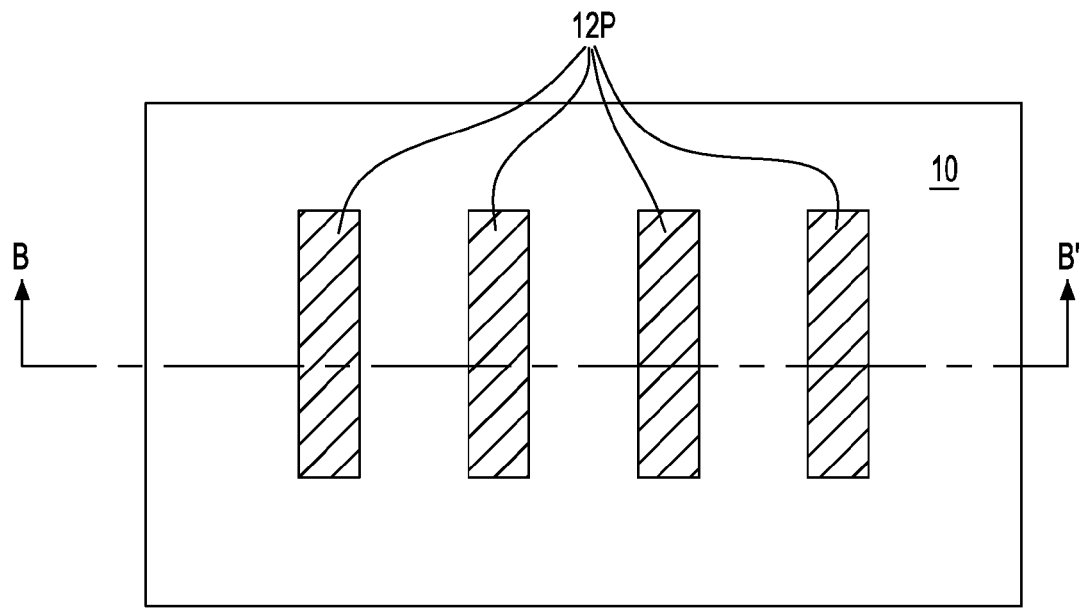
FIG. 3A is a top down view of the exemplary semiconductor structure of FIGS. 2A-2B after patterning the semiconductor material layer to provide semiconductor pillars utilizing remaining portions of the hard mask layer as an etch mask.
Figure 3B:
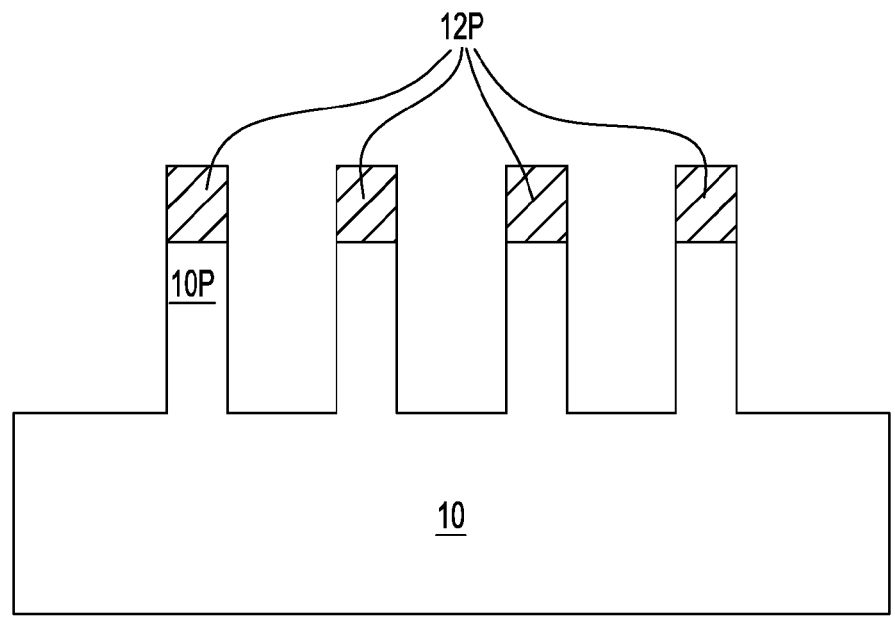
FIG. 3B is a cross sectional view of the exemplary semiconductor structure of FIG. 3A along vertical plane B-B'.

Referring now to FIGS. 3A-3B, there are illustrated various views of the exemplary semiconductor structure of FIGS. 2A-2B after patterning the semiconductor material layer 10 to provide semiconductor pillars 10P utilizing remaining portions of the hard mask layer (i.e., each hard mask portion 12P) as an etch mask. The patterning process used to define the semiconductor pillars 10P includes one of the etching steps mentioned above for etching the hard mask layer 12. In one embodiment, the patterning of the semiconductor material layer 10 includes an anisotropic etch such as, for example, a crystallographic preferential etch such as TMAH on silicon, to have an atomic smooth surface, or a reactive ion etch. The sidewall surface of the semiconductor pillar 10P can be any crystal orientation. For some cases for example, it may be preferred to have each semiconductor pillar 10P sidewall surface be a (111) oriented surface. In the illustrated embodiment, each semiconductor pillar 10P extends upward from a remaining portion of the semiconductor material layer 10. In other embodiments (not shown), each semiconductor pillar extends upwards from an underlying semiconductor material layer or an insulator layer.

Each semiconductor pillar 10P has a width that is within the range mentioned above for each hard mask portion 12P. Each semiconductor pillar 10P may have a height from 10 nm to 100 nm. Other heights that are lesser than, or greater than, the aforementioned height range may also be employed as the height of each semiconductor pillar 10P. In some embodiments and as shown, each semiconductor pillar 10P has sidewall surfaces that are vertically aligned to the sidewall surfaces of the corresponding overlying hard mask portion 12P.

Figure 4A:
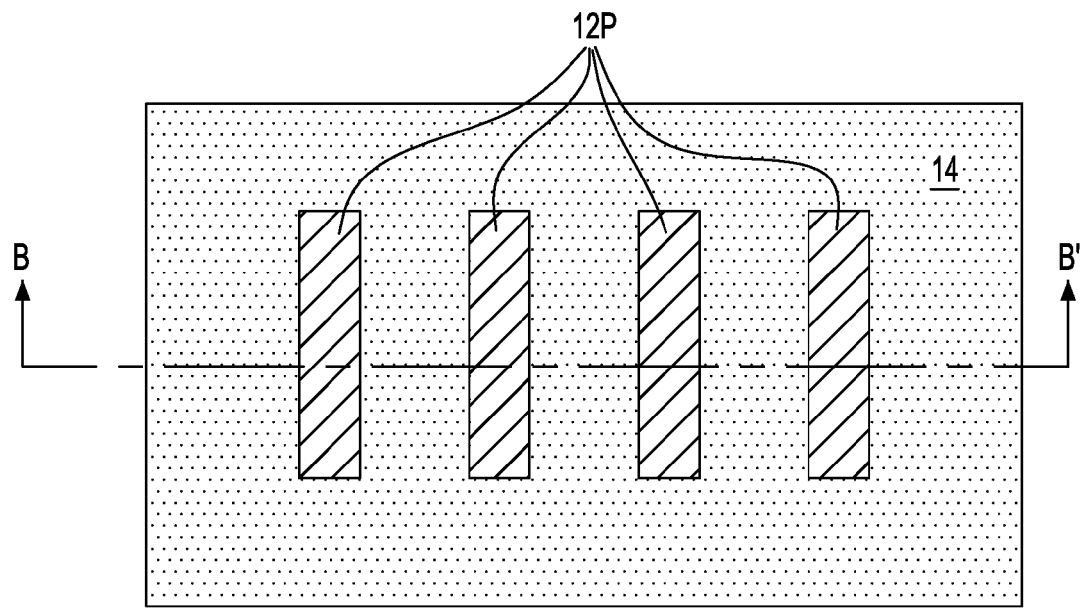
FIG. 4A is a top down view of the exemplary semiconductor structure of FIGS. 3A-3B after forming a local isolation region between each semiconductor pillar.
Figure 4B:
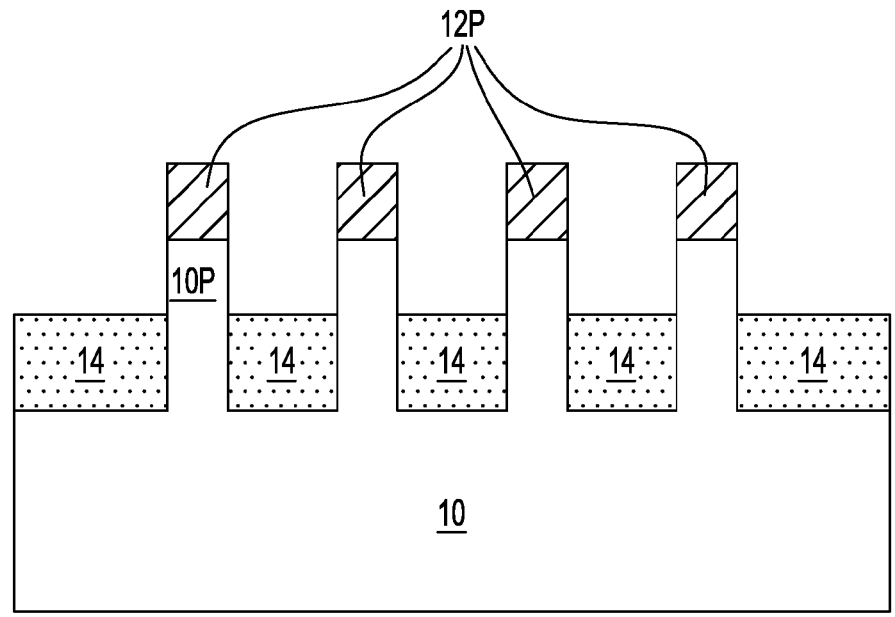
FIG. 4B is a cross sectional view of the exemplary semiconductor structure of FIG. 4A along vertical plane B-B'.

Referring now to FIGS. 4A-4B, there are illustrated the exemplary semiconductor structure of FIGS. 3A-3B after forming a local isolation region 14 between each semiconductor pillar 10P. Each local isolation region 14 is formed partially within a gap that is present between each semiconductor pillar 10P such that each local isolation region 14 is formed surrounding a bottom sidewall portion of each semiconductor pillar 10P.

The height of each local isolation region 14 does not extend to the height of each semiconductor pillar 10P and thus an upper sidewall portion of each semiconductor pillar 10P is bare at this point of the present application. In some embodiments and as shown, a bottommost surface of each local isolation region 14 contacts a remaining portion of the semiconductor material layer 10. In yet another embodiment (not shown), the bottommost surface of each local isolation region 14 may contact the insulator layer of an SOI substrate, or, in the case of a stack of semiconductor materials, the bottommost surface of each local isolation region 14 may contact a semiconductor material other than the semiconductor material layer 10.

Each local isolation region 14 may be formed by first forming a trench dielectric material such as, for example, a trench oxide, utilizing a deposition process such as, for example, chemical vapor deposition or plasma enhanced chemical vapor deposition. The deposition process by itself may be sufficient to provide each local isolation region 14.

In some embodiments, and when the deposited trench dielectric material is formed above the topmost surface of each hard mask portion 12P, a planarization such as, for example, chemical mechanical polishing is first used, and thereafter an etch back step is then employed to provide the local isolation regions 14. In other embodiments, and when the deposited trench dielectric material is formed at or above the topmost surface of each semiconductor pillar 10, an etch back step is employed to provide the local isolation regions 14.

Figure 5A:
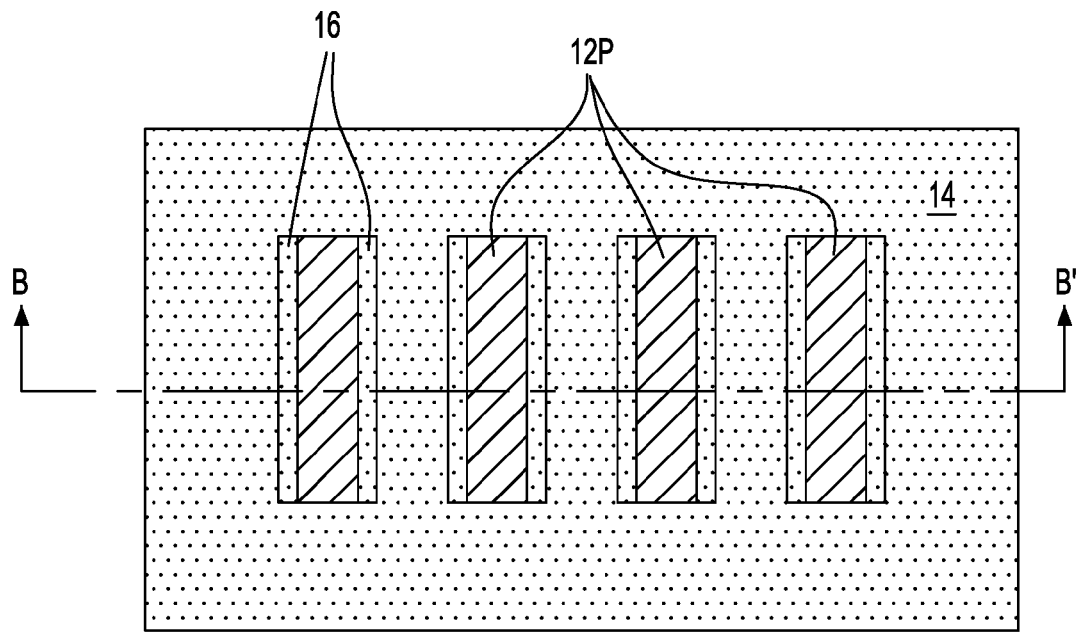
FIG. 5A is a top down view of the exemplary semiconductor structure of FIGS. 4A-4B after forming a spacer along at least exposed sidewalls of each semiconductor pillar.
Figure 5B:
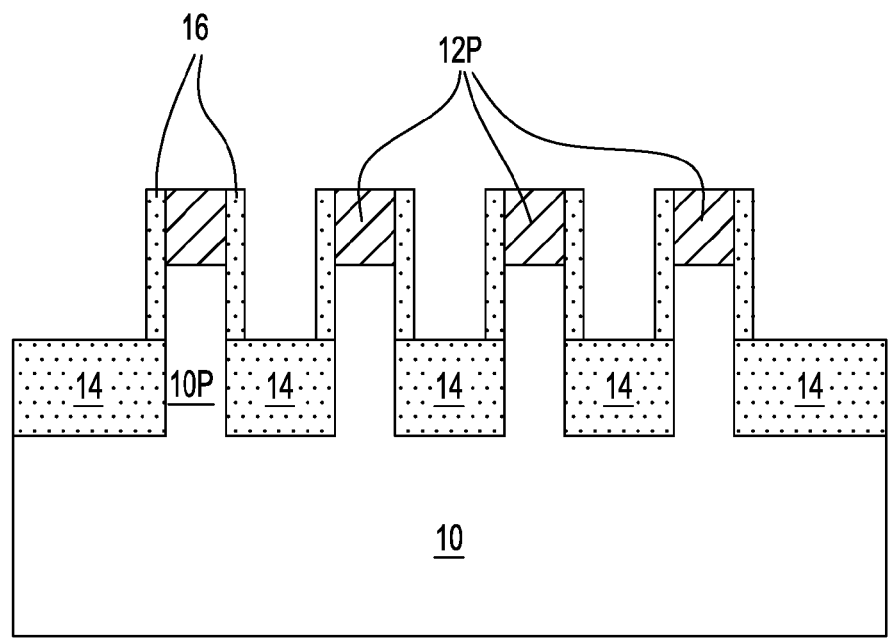
FIG. 5B is a cross sectional view of the exemplary semiconductor structure of FIG. 5A along vertical plane B-B'.

Referring now to FIGS. 5A-5B, there are illustrated the exemplary semiconductor structure of FIGS. 4A-4B after forming a spacer 16 along at least exposed sidewalls of each semiconductor pillar 10P. As is shown, each spacer 16 has a bottommost surface that contacts a portion of a topmost surface of an underlying local isolation region 14. Each spacer 16 also has a topmost surface that may be coplanar with a topmost surface of each hard mask portion 12P. As is further shown, the spacer 16 does not fill the entirety of the gap that is located between each neighboring semiconductor pillar 10P.

Each spacer 16 is composed of a spacer dielectric material that has a different etch rate than at least the hard mask material that provides each hard mask portion 12P. In one example, spacer dielectric material that provides each spacer 16 may be composed of silicon dioxide, while each hard mask portion 12P may be composed of silicon nitride. Each sacrificial spacer 16 may be formed by first depositing a contiguous layer of the spacer dielectric material, and thereafter subjecting the contiguous layer of the spacer dielectric material to a spacer etching process. The thickness of each spacer 16 can be from 2 nm to 20 nm thick. Other thicknesses that are lesser than 2 nm, or greater than 20 nm can be used.

Figure 6A:
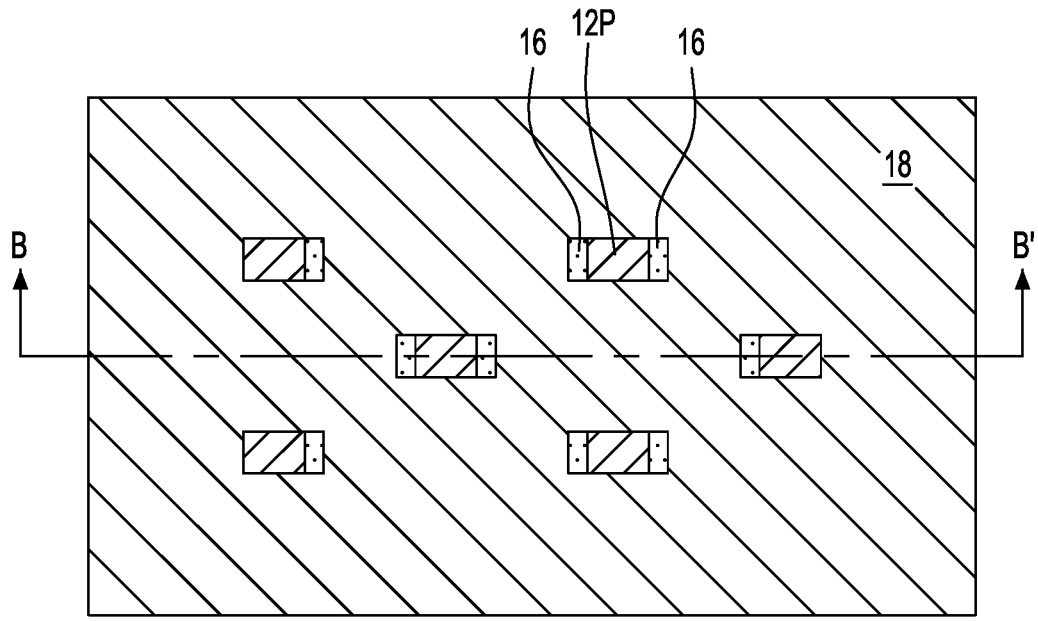
FIG. 6A is a top down view of the exemplary semiconductor structure of FIGS. 5A-5B after forming a patterned resist containing openings formed therein.
Figure 6B:
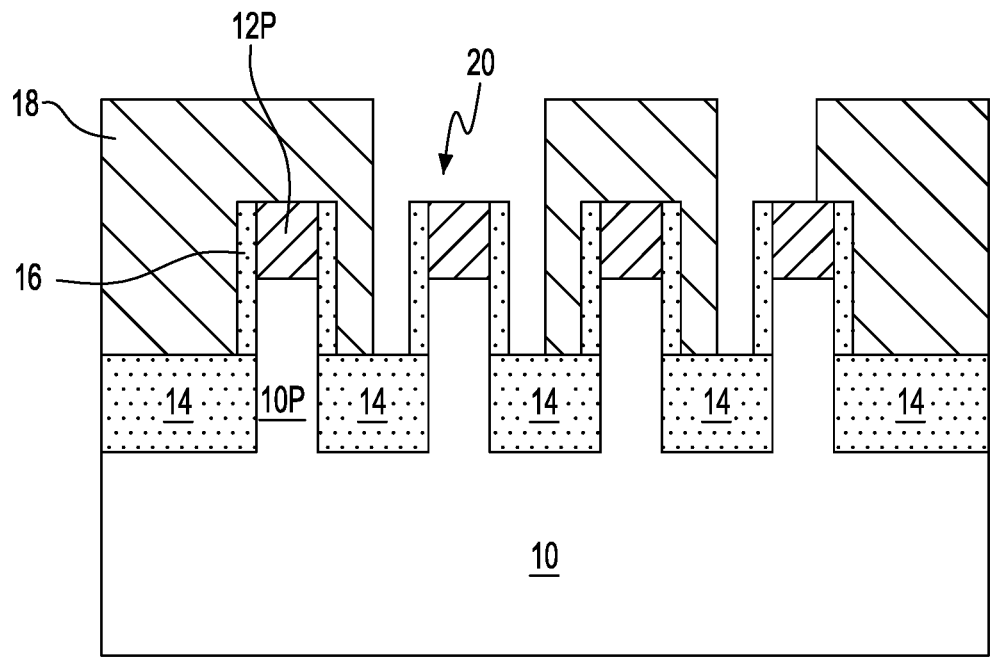
FIG. 6B is a cross sectional view of the exemplary semiconductor structure of FIG. 6A along vertical plane B-B'.

Referring now to FIGS. 6A-6B, there are illustrated various views of the exemplary semiconductor structure of FIGS. 5A-5B after forming a patterned resist 18 containing openings 20 formed therein. The patterned resist 18 may be composed of one of the photoresist material mentioned above for patterning the hard mask layer 12. The patterned resist 18 may be formed by first forming the photoresist material by utilizing a deposition process such as, for example, spin-on coating, and thereafter subjecting the photoresist material to photolithography (i.e., EUV exposure and development). Each opening 20 exposes at least one area in which a semiconductor pillar 10P is present. As is shown, some of the openings 20 are formed over an entire semiconductor pillar 10P, while other openings 20 are formed over a portion of a semiconductor pillar 10P. As is shown in the top down views, the openings 20 within the patterned resist 18 are orientated in a staggered configuration between each neighboring pair of semiconductor pillars 10P.

Each opening 20 may have a first width that can be in a range from 5 nm to 40 nm. Other first widths that are lesser than, or greater, than the aforementioned first width are also possible in the present application.

Figure 7A:
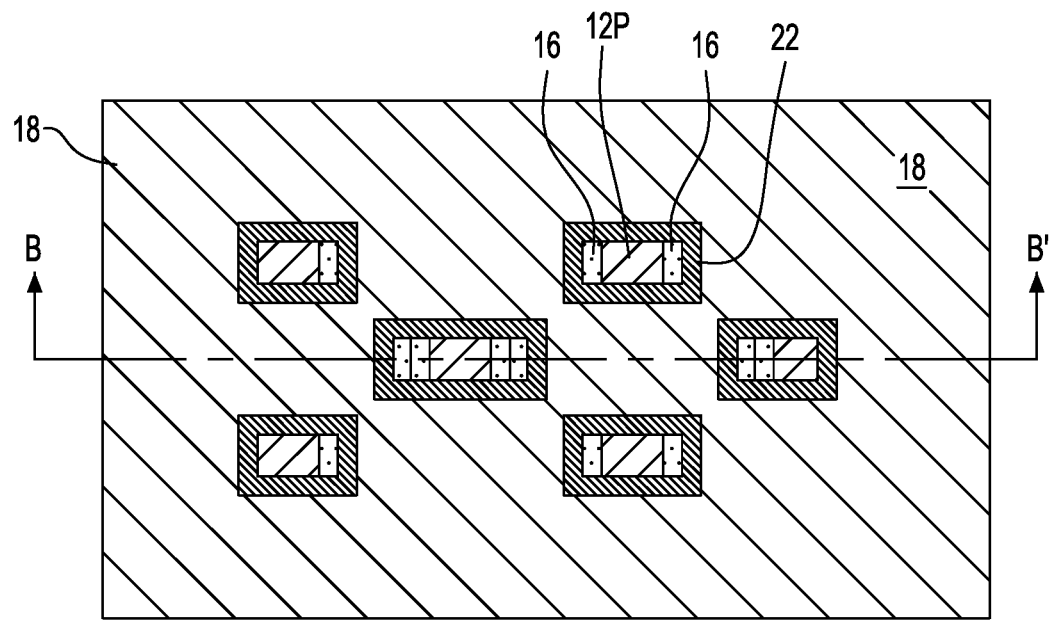
FIG. 7A is a top down view of the exemplary semiconductor structure of FIGS. 6A-6B after forming a sacrificial material along the sidewalls of the patterned resist in the openings so as to shrink the dimension of the openings.
Figure 7B:
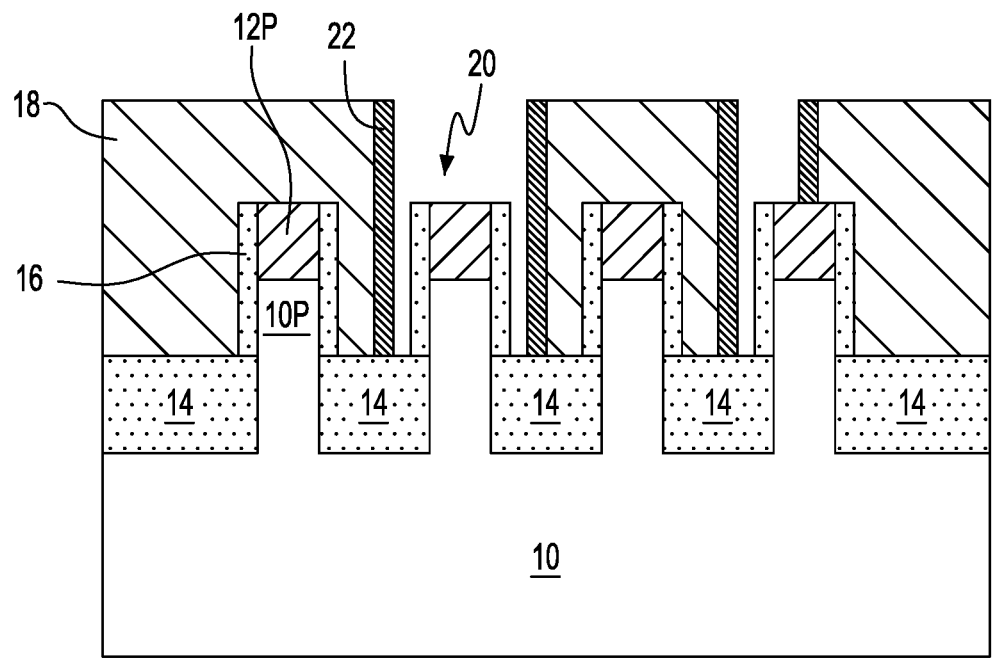
FIG. 7B is a cross sectional view of the exemplary semiconductor structure of FIG. 7A along vertical plane B-B'.

Referring now to FIGS. 7A-7B, there are illustrated various views of the exemplary semiconductor structure of FIGS. 6A-6B after forming a sacrificial material 22 along the sidewalls of the patterned resist 18 in the openings 20 so as to shrink the dimension of the openings 20. In some embodiments, this step of forming the sacrificial material 22 can be omitted.

In one embodiment of the present application, the sacrificial material 22 may be composed of amorphous carbon. Other materials can also be employed in the present application as the material that provides the sacrificial material 22 so long as the sacrificial material 22 is different in composition from the spacer 16. Examples include a porous oxide material. The sacrificial material 22 may be formed by a deposition process. An optional etch may follow the deposition of the material that provides the sacrificial material 22. Each opening 20 containing the sacrificial material 22 may have a second width that is less than the first width.

Figure 8A:
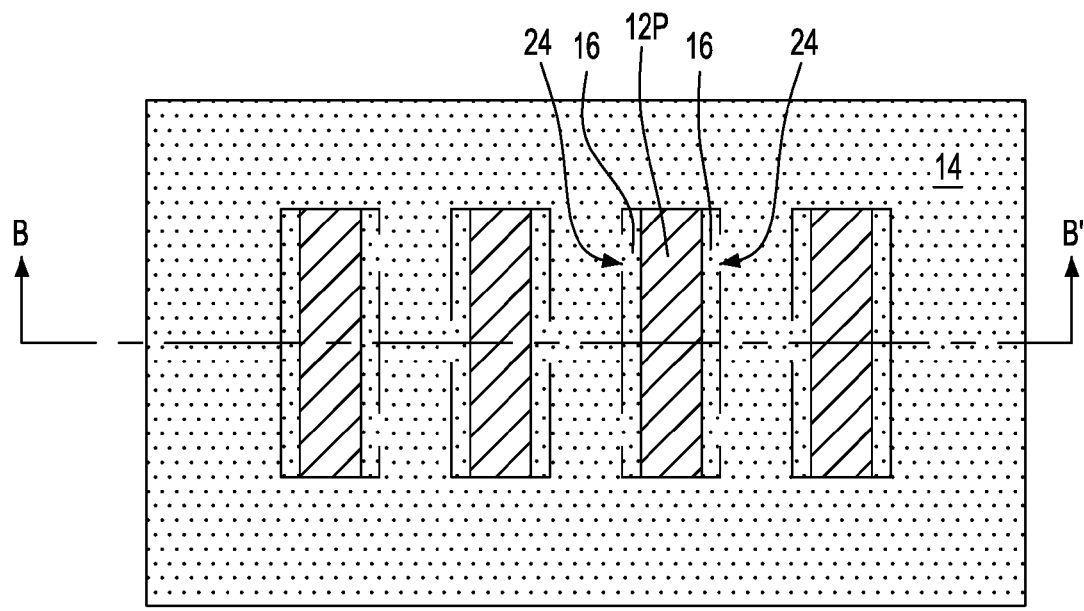
FIG. 8A is a top down view of the exemplary semiconductor structure of FIGS. 7A-7B after providing a seed hole in each of the spacers to expose a portion of a sidewall surface of each semiconductor pillar, and removing the patterned resist and, if present, the sacrificial material.
Figure 8B:
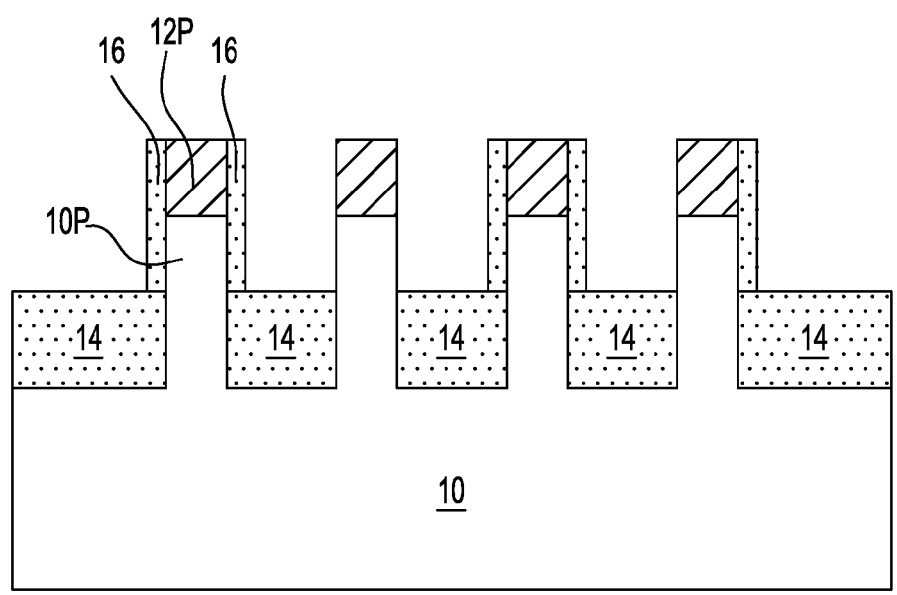
FIG. 8B is a cross sectional view of the exemplary semiconductor structure of FIG. 8A along vertical plane B-B'.

Referring now to FIGS. 8A-8B, there are illustrated the exemplary semiconductor structure of FIGS. 7A-7B after providing a seed hole 24 in each of the spacers 16 to expose a portion of a sidewall surface of each semiconductor pillar 10P and removing the patterned resist 18 and, if present the sacrificial material 22. The seed hole 24 can be formed into each of the spacers 16 utilizing a wet etching process that is selective in removing the spacer dielectric material that provides each spacer 16. In one example, hydrofluoric acid can be used to provide each seed hole 24. The patterned resist 18 and, if present the sacrificial material 22 may be removed utilizing conventional processes that are well known to those skilled in the art. The portion of the sidewall surface of each semiconductor pillar 10P that is exposed by the seed hole 24 will be used as a seed material for the subsequent growth of a semiconductor nanowire.

Figure 9A:
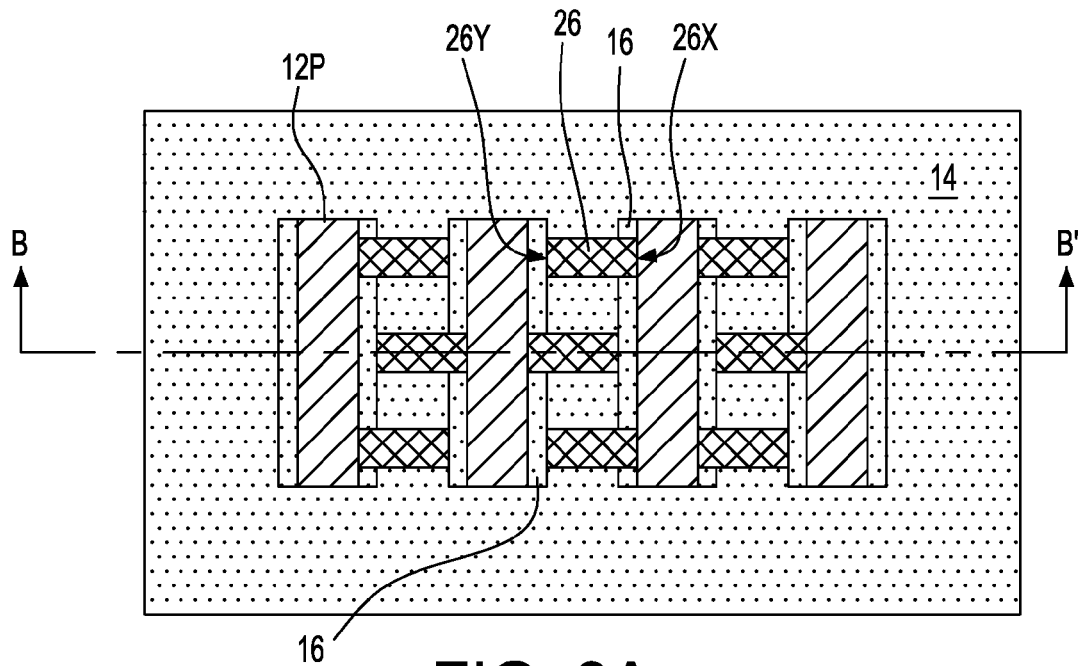
FIG. 9A is a top down view of the exemplary semiconductor structure of FIGS. 8A-8B after epitaxially growing a semiconductor nanowire laterally outward from the exposed portion of the sidewall surface of each semiconductor pillar and through each seed hole.
Figure 9B:
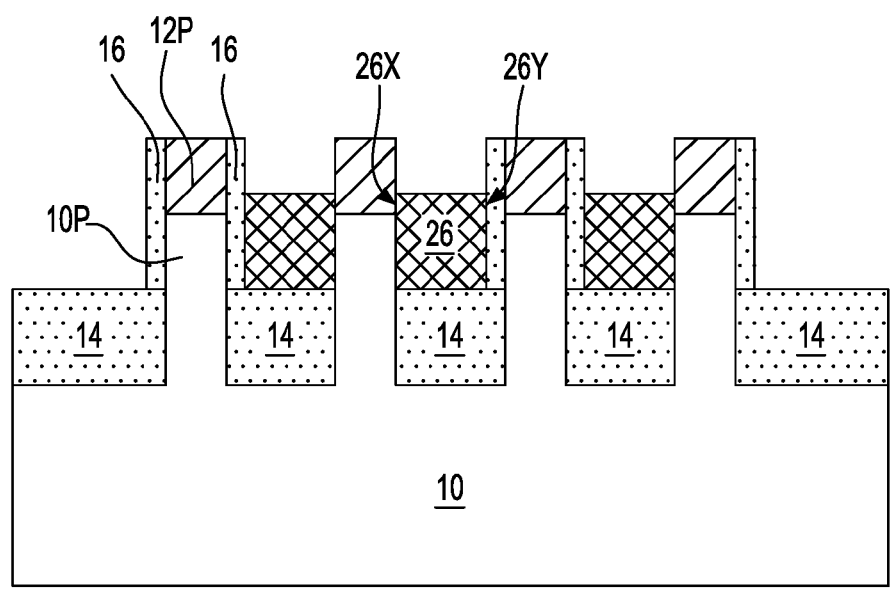
FIG. 9B is a cross sectional view of the exemplary semiconductor structure of FIG. 9A along vertical plane B-B'.

Referring now to FIGS. 9A-9B, there are illustrated various views of the exemplary semiconductor structure of FIGS. 8A-8B after epitaxially growing (or depositing) a semiconductor nanowire 26 laterally outward from the exposed sidewalls of each semiconductor pillar 10P and through each seed hole 24. Each semiconductor nanowire 26 is oriented parallel to each other. Also, each semiconductor nanowire 26 that is formed has one end 26X that is located in a seed hole 24 of one of the spacers, and another end 26Y that directly contacts a remaining portion of a spacer that is present on a neighboring semiconductor pillar. Also, the end 26X of each semiconductor nanowire that is in the seed hole 24 directly contacts the exposed sidewall of one of the semiconductor pillars. The semiconductor nanowire that is formed utilizing the method of the present application has fewer defects than prior art methods.

The terms "epitaxial growth and/or deposition" and "epitaxially formed and/or grown" mean the growth of a semiconductor material on a deposition surface of a semiconductor material, in which the semiconductor material being grown has the same crystalline characteristics as the semiconductor material of the deposition surface. In an epitaxial deposition process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material has the same crystalline characteristics as the deposition surface on which it is formed. For example, an epitaxial semiconductor material deposited on a {100} crystal surface will take on a {100} orientation. In the present embodiment, each semiconductor nanowire 26 has an epitaxial relationship with the growth surface (i.e., exposed sidewall portion) of the semiconductor pillar 10P.

Examples of various epitaxial growth process apparatuses that can be employed in the present application include, e.g., rapid thermal chemical vapor deposition (RTCVD), low-energy plasma deposition (LEPD), ultra-high vacuum chemical vapor deposition (UHVCVD), atmospheric pressure chemical vapor deposition (APCVD) and molecular beam epitaxy (MBE). The temperature for epitaxial deposition typically ranges from 550° C. to 900° C. Although higher temperature typically results in faster deposition, the faster deposition may result in crystal defects and film cracking. The epitaxial growth of each semiconductor nanowire 26 can be performed utilizing any well known precursor gas or gas mixture. Carrier gases like hydrogen, nitrogen, helium and argon can be used.

Each semiconductor nanowire 26 is composed of one of the semiconductor materials mentioned above for the semiconductor material layer 10. In one embodiment of the present application, each semiconductor nanowire 26 is composed of a same semiconductor material as that which provides the semiconductor material layer 10. For example, the semiconductor material layer 10 (and hence the semiconductor pillars 10P) and the semiconductor nanowires 26 may each be composed of silicon. In another embodiment of the present application, each semiconductor nanowire is composed of a different semiconductor material than that which provides the semiconductor material layer 10. For example, the semiconductor material layer 10 (and hence the semiconductor pillars 10P) may be composed of silicon, while the semiconductor nanowires 26 may be composed of a high mobility channel material such as, for example, a III-V compound semiconductor.

Each semiconductor nanowire 26 may have width from 2 nm to 40 nm, a length from 20 nm to 200 nm, and a height from 10 nm to 40 nm. Other dimensions (i.e., width, length and height) are possible for each semiconductor nanowire 26. In some embodiments, a wet etch or any other semiconductor nanowire thinning step may be performed to reduce the dimensions of each semiconductor nanowire 26.

Figure 10A:
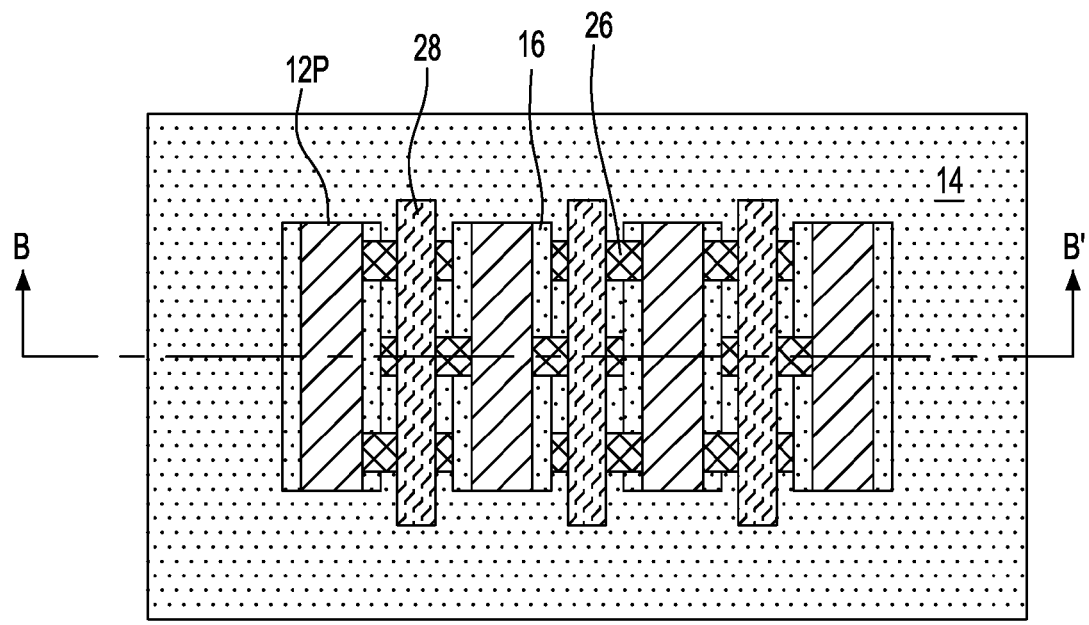
FIG. 10A is a top down view of the exemplary semiconductor structure of FIGS. 9A-9B after forming a sacrificial gate structure straddling over a portion of each semiconductor nanowire.
Figure 10B:
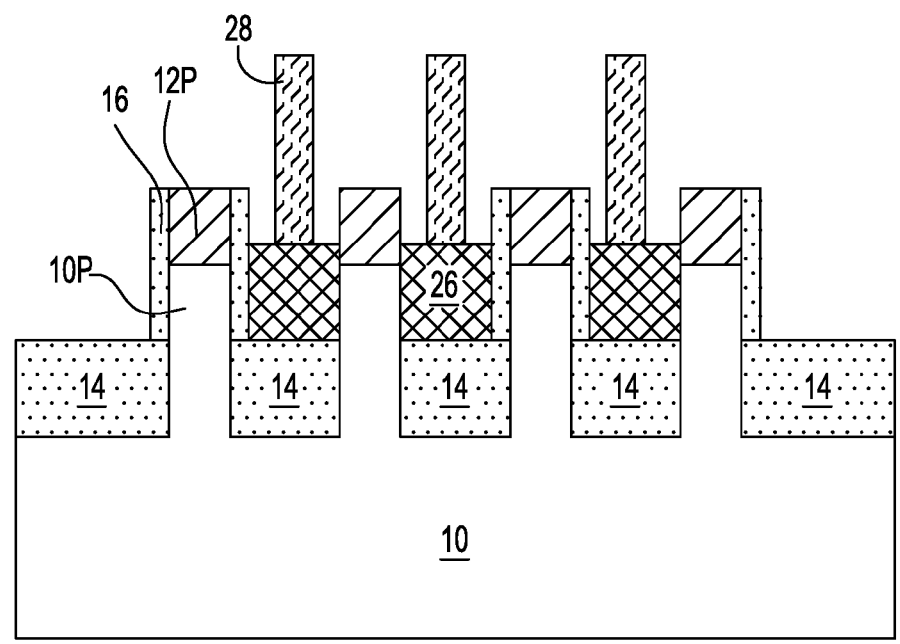
FIG. 10B is a cross sectional view of the exemplary semiconductor structure of FIG. 10A along vertical plane B-B'.

Referring now to FIGS. 10A-10B, there are illustrated various views of the exemplary semiconductor structure of FIGS. 9A-9B after forming a sacrificial gate structure 28 straddling over a portion of each semiconductor nanowire 26. By "straddling" it is meant that the sacrificial gate structure 28 is present on each side of a semiconductor nanowire 26 and has a portion that is present atop a semiconductor nanowire 26. The portion of the semiconductor nanowire that the sacrificial gate structure (and the subsequently formed functional gate structure) is present may be referred to herein as a channel portion (or channel region). The sacrificial gate structures 28 and hence the functional gate structure are orientated perpendicular to each semiconductor nanowire 26.

The term "sacrificial gate structure" is used throughout the present application to denote a material or material stack that serves as a placeholder structure for a functional gate structure to be subsequently formed. In one embodiment, each sacrificial gate structure 28 can include, from bottom to top, of sacrificial dielectric material and a sacrificial gate material. In another embodiment, each gate sacrificial gate structure 28 may include only the sacrificial gate material.

When present the sacrificial gate dielectric material may include an oxide, nitride, and/or oxynitride. In one example, the sacrificial gate dielectric material may be composed of silicon dioxide and/or silicon nitride. The sacrificial gate material can include any material that can be selectively removed from the structure during a subsequently performed etching process. In one embodiment, the sacrificial gate material may be composed of polysilicon. In another embodiment of the present application, the sacrificial gate material may be composed of a metal such as, for example, Al, W, or Cu.

Each sacrificial gate structure 28 is formed by depositing the material or materials that provide a sacrificial gate stack and thereafter an etch can be used to pattern the sacrificial gate stack. Each sacrificial gate stack 28 can have a thickness from 50 nm to 300 nm, although lesser and greater thicknesses can also be employed.

In some embodiments (not shown), a functional gate structure as defined herein below is formed instead of the sacrificial gate structures. Also, and in other embodiments (not shown), a first set of sacrificial gate structures is formed straddling over some of the semiconductor nanowires, while a first set of functional gate structure is formed straddling over other semiconductor nanowires. In such instances, block mask technology may be employed to form the sacrificial gate structures and functional gate structures at this point of the present application.

Figure 11A:
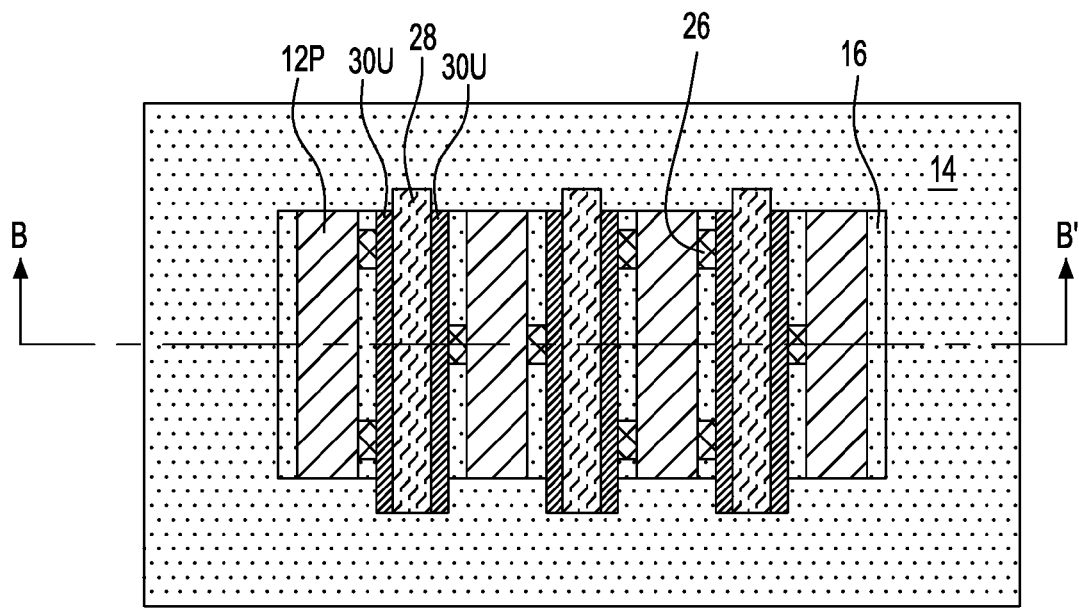
FIG. 11A is a top down view of the exemplary semiconductor structure of FIGS. 10A-10B after formation of a source/drain structure on each side of the sacrificial gate structure.
Figure 11B:
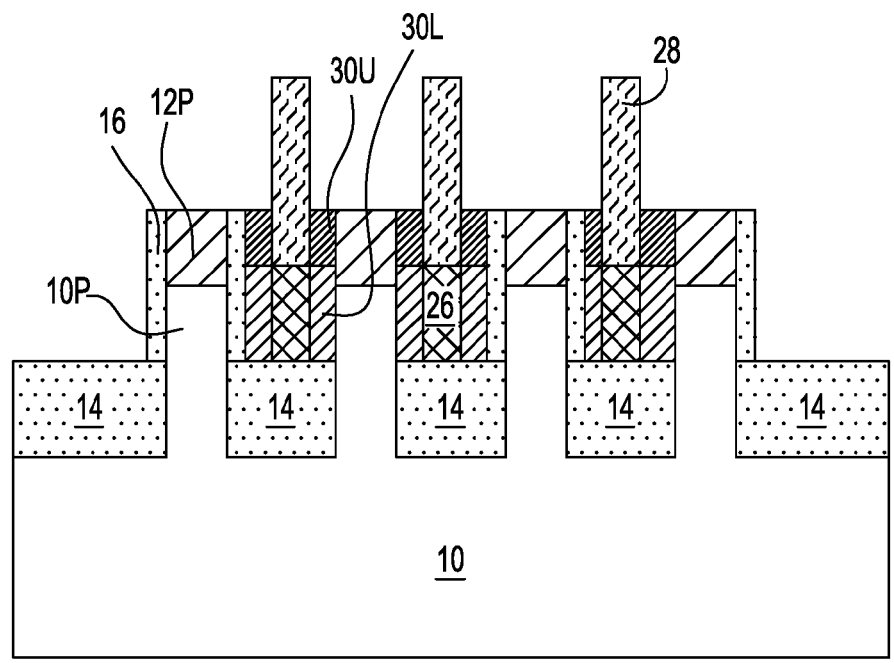
FIG. 11B is a cross sectional view of the exemplary semiconductor structure of FIG. 11A along vertical plane B-B'.

Referring now to FIGS. 11A-11B, there are illustrated various views of the exemplary semiconductor structure of FIGS. 10A-10B after formation of a source/drain structure on each side of the sacrificial gate structure 28. Each source/drain structure includes an upper portion 30U and a lower portion 30L. The lower portion 30L of each source/drain structure includes a doped portion of the semiconductor nanowire 26 not protected by the sacrificial gate structure 28 and thus adjacent to the channel portion of the semiconductor nanowire. The upper portion 30U of each source/drain includes a doped semiconductor material that is epitaxially grown on the exposed portions of the semiconductor nanowire 26 not protected by the sacrificial gate structure 28.

Each source/drain structure (30U, 30L) can be formed by first providing the doped semiconductor material by utilizing an epitaxial growth process as mentioned above. The semiconductor material that forms the upper portion 30U of each source/drain structure may include one of the semiconductor materials mentioned above for the semiconductor material layer 10. In one embodiment of the present application, the semiconductor material that provides the upper portion 30U of each source/drain structure may be a same semiconductor material as the semiconductor material that provides each semiconductor nanowire 26. In another embodiment of the present application, the semiconductor material that provides the upper portion 30U of each source/drain structure may be a different semiconductor material than the semiconductor material that provides each semiconductor nanowire 26.

The dopant that is present in the doped semiconductor material that provides the upper portion 30U of each source/drain structure may be a p-type dopant or an n-type dopant. The term "p-type" refers to the addition of impurities to an intrinsic semiconductor that creates deficiencies of valence electrons. In a silicon-containing semiconductor material, examples of p-type dopants, i.e., impurities, include, but are not limited to, boron, aluminum, gallium and indium. "N-type" refers to the addition of impurities that contributes free electrons to an intrinsic semiconductor. In a silicon containing semiconductor material, examples of n-type dopants, i.e., impurities, include, but are not limited to, antimony, arsenic and phosphorous. The dopant of the upper portion 30U of each source/drain structure may introduce into the precursor source gas used to epitaxially grow the doped semiconductor material. Alternatively, the dopant of the upper portion 30U of each source/drain structure may introduced into an intrinsically grown semiconductor material utilizing one of ion implantation or gas phase doping. The upper portion 30U of each source/drain structure may have a dopant concentration that can be within a range from $1\times10^{19}$ atoms/cm$^3$ to $1\times10^{21}$ atoms/cm$^3$.

The lower portion 30L of each source/drain structure can be formed by diffusion of dopants from the upper portion 30U into the underlying portion of the semiconductor nanowires 26 that are not protected by the sacrificial gate structure 28. The diffusion of dopants may be performed utilizing an annealing process that causes diffusion of dopants from one material to another material. In one embodiment, a thermal anneal performed at a temperature from 300° C. to 1100° C. may be performed. The lower portion 30L of each source/drain structure may have a dopant concentration that can be within a range from $1\times10^{19}$ atoms/cm$^3$ to $1\times10^{21}$ atoms/cm$^3$.

In some embodiments (not shown), a gate spacer may be formed around each sacrificial gate structure 28 prior to forming the source/drain structures (30U, 20L). The gate spacer may include one of the dielectric spacer materials mentioned above for spacer 16, and the gate spacer may be formed utilizing the same technique as mentioned above for forming spacer 16.

Figure 12A:
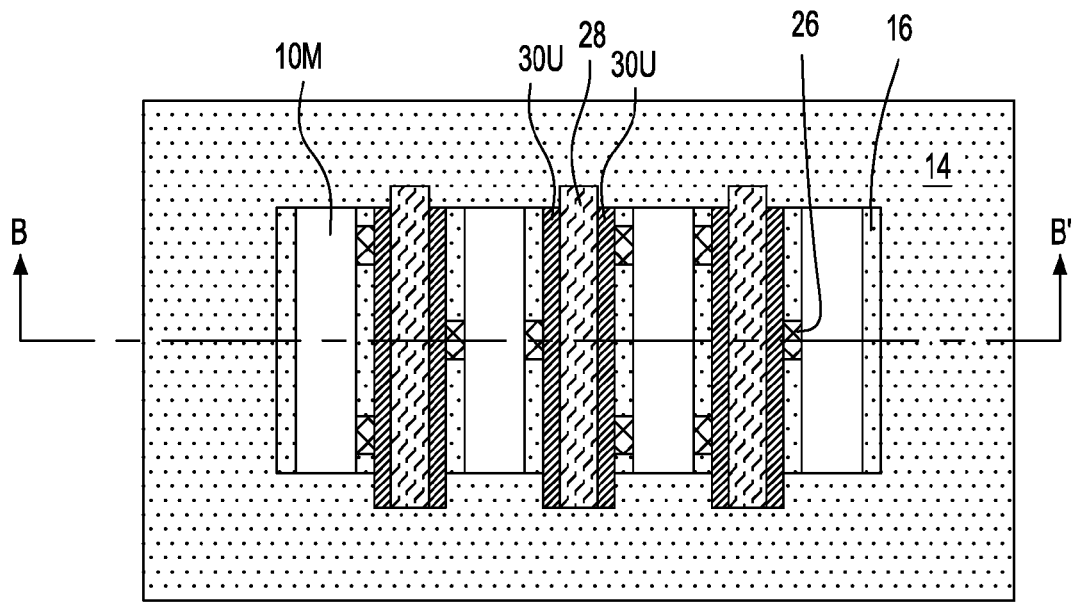
FIG. 12A is a top down view of the exemplary semiconductor structure of FIGS. 11A-11B after removing a portion of each semiconductor pillar.
Figure 12B:
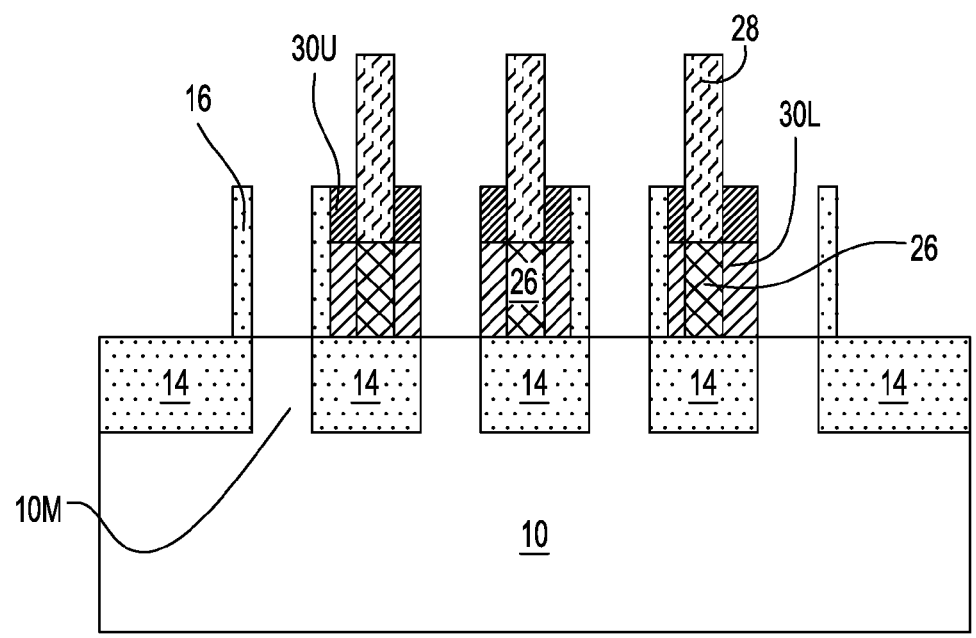
FIG. 12B is a cross sectional view of the exemplary semiconductor structure of FIG. 12A along vertical plane B-B'.

Referring now to FIGS. 12A-12B, there are illustrated various views of the exemplary semiconductor structure of FIGS. 11A-11B after removing a portion of each semiconductor pillar 10P. The removal of a portion of each semiconductor pillar 10P may be performed utilizing an etching process that is selective in removing the semiconductor material that provides the semiconductor pillar 10P. In some embodiments, a planarization process may be employed. Prior to removing a portion of each semiconductor pillar 10P, the hard mask portion 12P is entirely removed utilizing an etch that is selective in removing the hard mask material that provides each hard mask portion 12P. As is shown in the illustrated embodiment, a portion of each semiconductor pillar 10P remains. Each remaining portion of the semiconductor pillar 10P can be referred to herein as a mesa portion 10M of a semiconductor material (which is the same as semiconductor material layer 10 mentioned above). Each mesa portions 10M has a topmost surface that is coplanar with a topmost surface of each local isolation region 14.

Figure 13A:
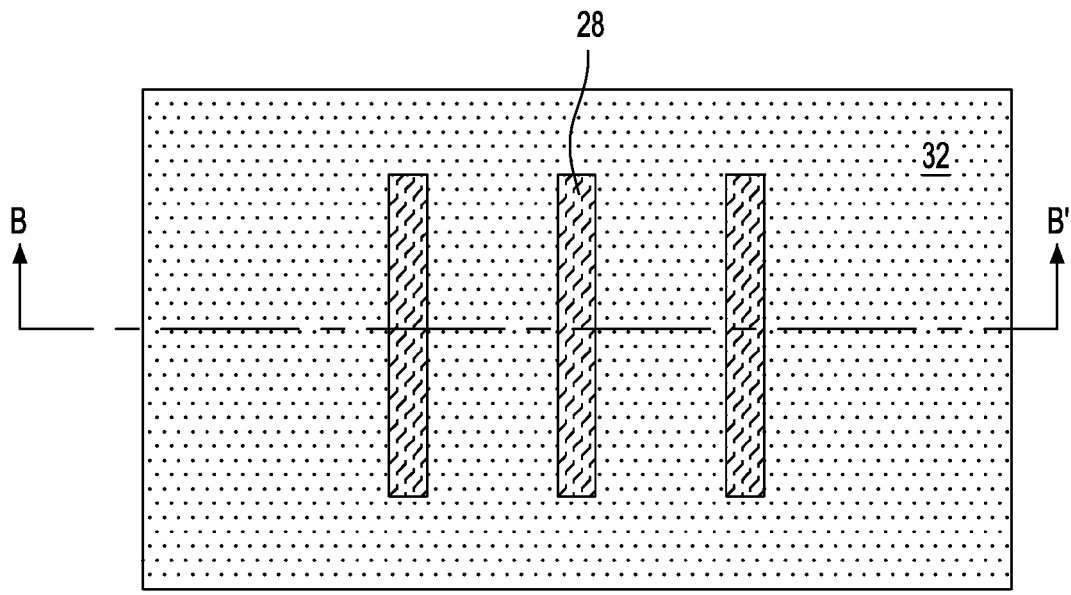
FIG. 13A is a top down view of the exemplary semiconductor structure of FIGS. 12A-12B after forming a middle-of the-line (MOL) dielectric material.
Figure 13B:
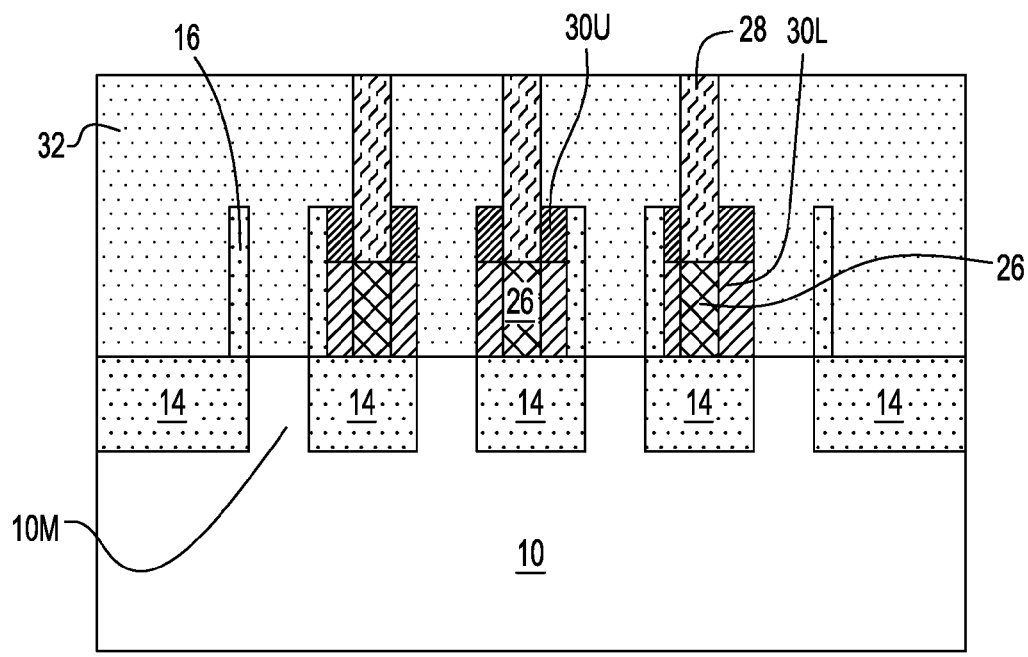
FIG. 13B is a cross sectional view of the exemplary semiconductor structure of FIG. 13A along vertical plane B-B'.

Referring now to FIGS. 13A-13B, there are illustrated various views of the exemplary semiconductor structure of FIGS. 12A-12B after forming a middle-of the-line (MOL) dielectric material 32. As is shown, the MOL dielectric material 32 has a topmost most surface that is coplanar with a topmost surface of each sacrificial gate structure 26.

The MOL dielectric material 32 may be composed of, for example, silicon dioxide, undoped silicate glass (USG), fluorosilicate glass (FSG), borophosphosilicate glass (BPSG), a spin-on low-k dielectric layer, a chemical vapor deposition (CVD) low-k dielectric layer or any combination thereof. The term "low-k" as used throughout the present application denotes a dielectric material that has a dielectric constant of less than silicon dioxide. In another embodiment, a self-planarizing material such as a spin-on glass (SOG) or a spin-on low-k dielectric material such as SiLK™ can be used as the MOL dielectric material 32. The use of a self-planarizing dielectric material as MOL dielectric material 32 may avoid the need to perform a subsequent planarizing step.

In one embodiment, the MOL dielectric material 32 can be formed utilizing a deposition process including, for example, chemical vapor deposition (CVD), plasma enhanced chemical vapor deposition (PECVD), evaporation or spin-on coating. In some embodiments, particularly when non-self-planarizing dielectric materials are used as MOL dielectric material 32, a planarization process or an etch back process follows the deposition of the dielectric material. The thickness of the MOL dielectric material 32 that can be employed in the present application may vary depending on the type of dielectric material employed as well as the method that was employed in forming the same. In one embodiment, the MOL dielectric material 32 has a thickness from 80 nm to 500 nm. Other thicknesses that are greater or lesser than the range provided above can also be used for the MOL dielectric material 32.

Figure 14A:
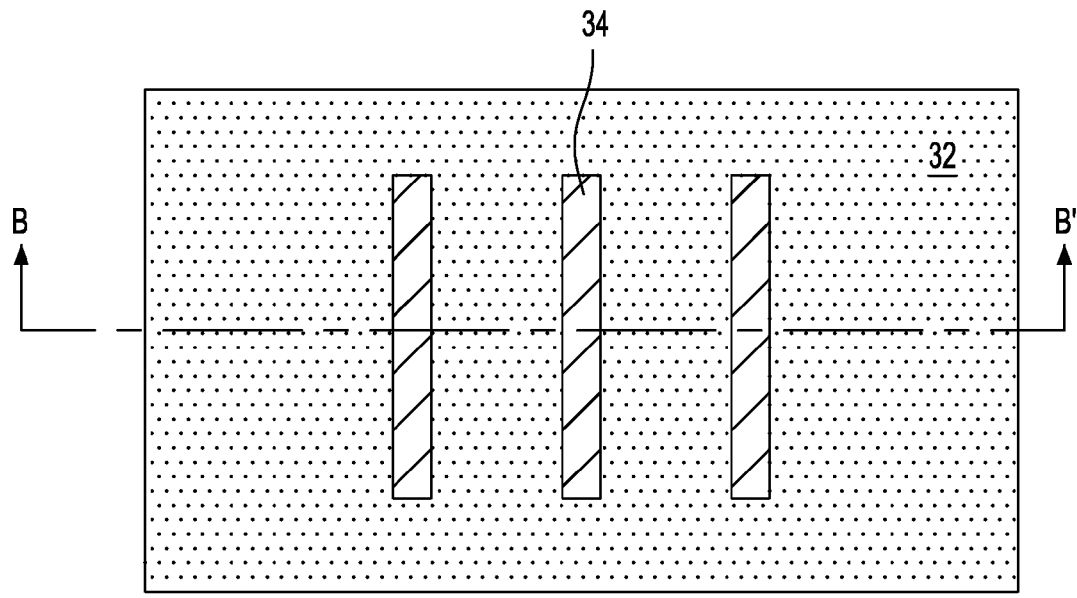
FIG. 14A is a top down view of the exemplary semiconductor structure of FIGS. 13A-13B after replacing the sacrificial gate structure with a functional gate structure in accordance with an embodiment of the present application.
Figure 14B:
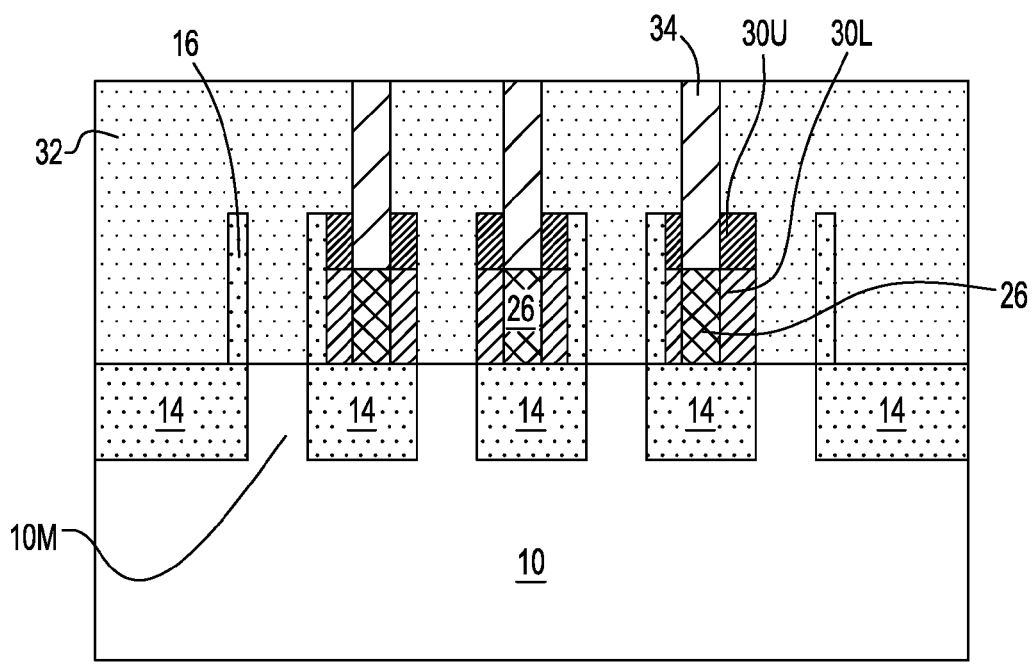
FIG. 14B is a cross sectional view of the exemplary semiconductor structure of FIG. 14A along vertical plane B-B'.

Referring now to FIGS. 14A-14B, there are illustrated various views of the exemplary semiconductor structure of FIGS. 13A-13B after replacing the sacrificial gate structure 28 with a functional gate structure 34 in accordance with an embodiment of the present application. The step of the present application may be skipped in instances in which the gate structure previously formed in FIGS. 10A-10B is a functional gate structure. Each sacrificial gate structure 28 may be replaced utilizing an anisotropic etching process such as, for example, reactive ion etching. The removal of each sacrificial gate structure 28 forms a gate cavity in which a functional gate structure will be subsequently formed. The gate cavity exposed the channel portion of the semiconductor nanowire 26.

By "functional gate structure" it is meant a permanent gate structure used to control output current (i.e., flow of carriers in the channel) of a semiconducting device through electrical or magnetic fields. At this point of the present application, each first functional gate 34 includes a gate dielectric portion (not shown) and a gate conductor portion (not shown).

The gate dielectric portion of each functional gate structure 34 may include a gate dielectric material. The gate dielectric material that provides the gate dielectric portion of each functional gate structure 34 can be an oxide, nitride, and/or oxynitride. In one example, the gate dielectric material that provides the gate dielectric portion can be a high-k material having a dielectric constant greater than silicon dioxide. Exemplary high-k dielectrics include, but are not limited to, $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, SiON, $SiN_x$, a silicate thereof, and an alloy thereof. Each value of x is independently from 0.5 to 3 and each value of y is independently from 0 to 2. In some embodiments, a multilayered gate dielectric structure comprising different gate dielectric materials, e.g., silicon dioxide, and a high-k gate dielectric, can be formed and used as the gate dielectric portion. In some embodiments, a first set of functional gate structures includes a first gate dielectric portion, while a second set of functional gate structures comprises a second gate dielectric portion. In such an embodiment, the first gate dielectric material portion of each first functional gate structure of the first and second sets of functional gate structures may be the same as, or different from, the second gate dielectric material portion.

The gate dielectric material used in providing the gate dielectric portion of each functional gate structure 34 can be formed by any deposition process including, for example, chemical vapor deposition (CVD), plasma enhanced chemical vapor deposition (PECVD), physical vapor deposition (PVD), sputtering, or atomic layer deposition. In some embodiments and when different gate dielectric materials are used in providing the gate dielectric portions of different functional gate structures, block mask technology can be used. In one embodiment of the present application, the gate dielectric material used in providing the gate dielectric portion can have a thickness in a range from 1 nm to 10 nm. Other thicknesses that are lesser than, or greater than, the aforementioned thickness range can also be employed for the gate dielectric material that may provide the gate dielectric portion.

The gate conductor portion of each functional gate structure 34 can include a gate conductor material. The gate conductor material used in providing the gate conductor portion of each functional gate structure 34 can include any conductive material including, for example, doped polysilicon, an elemental metal (e.g., tungsten, titanium, tantalum, aluminum, nickel, ruthenium, palladium and platinum), an alloy of at least two elemental metals, an elemental metal nitride (e.g., tungsten nitride, aluminum nitride, and titanium nitride), an elemental metal silicide (e.g., tungsten silicide, nickel silicide, and titanium silicide) or multilayered combinations thereof. In some embodiments, a first set of functional gate structures includes a first gate conductor portion, while a second set of functional gate structures comprises a second gate conductor portion. In such an embodiment, the first gate conductor portion may be the same as, or different from, the second gate conductor portion. For example, the first gate conductor portion may comprise an nFET gate metal, while the second gate conductor portion may comprise a pFET gate metal. In another example, the first gate conductor portion may comprise a pFET gate metal, while the second gate conductor portion may comprise an nFET gate metal.

The gate conductor material used in providing the gate conductor portion can be formed utilizing a deposition process including, for example, chemical vapor deposition (CVD), plasma enhanced chemical vapor deposition (PECVD), physical vapor deposition (PVD), sputtering, atomic layer deposition (ALD) or other like deposition processes. When a metal silicide is formed, a conventional silicidation process is employed. When a different gate conductor material is used for gate conductor portions of different functional gate structures, block mask technology can be used. In one embodiment, the gate conductor material used in providing the gate conductor portion has a thickness from 50 nm to 200 nm. Other thicknesses that are lesser than, or greater than, the aforementioned thickness range can also be employed for the gate conductor material used in providing the gate conductor portion.

Each functional gate structure 34 can be formed by first providing a gate dielectric material and a gate conductor material, and thereafter a planarization process such as, for example, chemical mechanical polishing (CMP) can be used. The gate dielectric material portion of the functional gate structure 34 may be U-shaped and the gate conductor material portion may be confined within the U-shaped gate dielectric material portion of the functional gate structure 34.

Figure 15A:
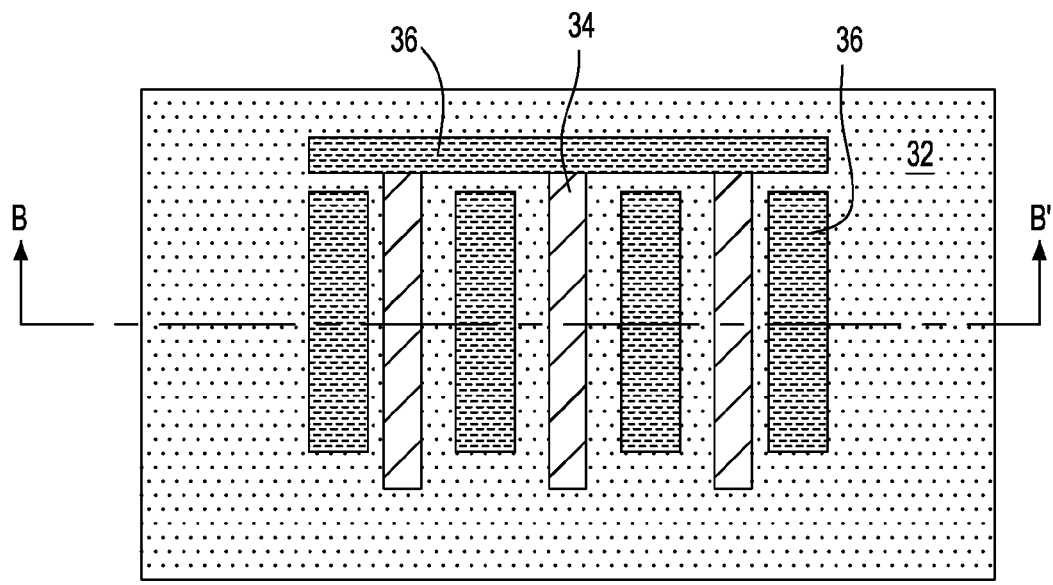
FIG. 15A is a top down view of the exemplary semiconductor structure of FIGS. 14A-14B after forming contact structures in the MOL dielectric material.
Figure 15B:
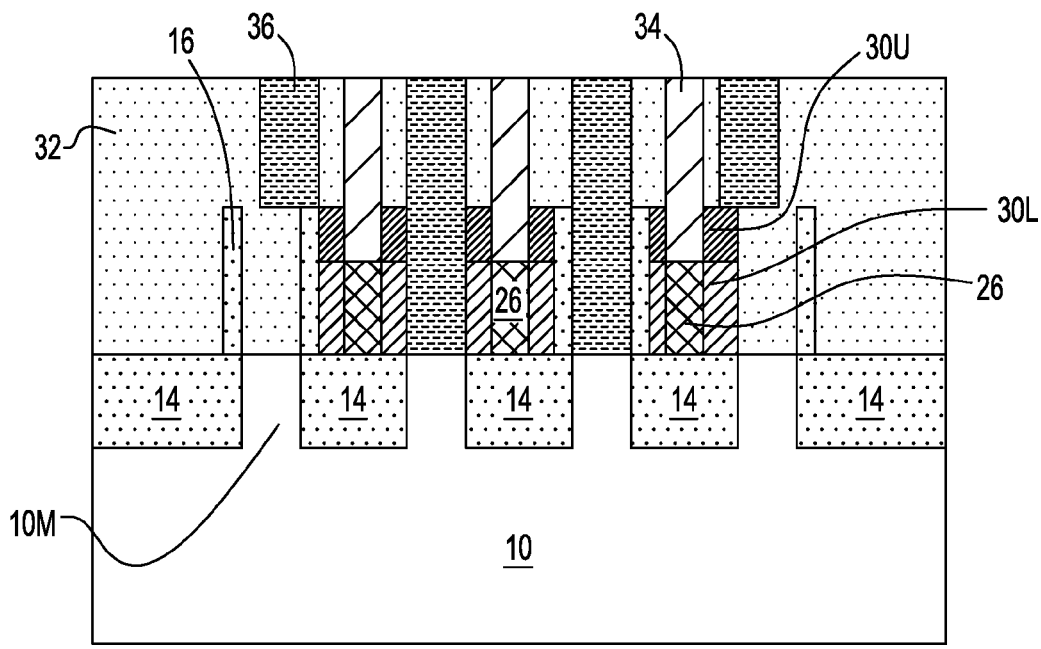
FIG. 15B is a cross sectional view of the exemplary semiconductor structure of FIG. 15A along vertical plane B-B'.

Referring now to FIGS. 15A-15B, there are illustrated various views of the exemplary semiconductor structure of FIGS. 14A-14B after forming contact structures 36 in the MOL dielectric material 32. The contact structure 36 can be formed by first providing a contact opening within the MOL dielectric material 32 utilizing lithography and etching. A contact metal such as, for example, tungsten, copper, aluminum or alloys thereof is then formed within each contact opening by utilizing a conventional deposition process. A planarization process may follow the deposition of the contact metal. As is shown one of the contact structures 36 contacts a sidewall of an upper portion 30U and a lower portion 30L of one of the source/drain structures.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A method of forming a semiconductor structure, said method comprising:
    providing a plurality of semiconductor pillars extending from a surface of a substrate, wherein a spacer is present on sidewall surfaces of each semiconductor pillar;
    forming a seed hole in a portion of each spacer that exposes a portion of at least one sidewall surface of each semiconductor pillar;
    epitaxially growing a semiconductor nanowire from said exposed portion of said at least one sidewall surface of each semiconductor pillar and entirely through each seed hole; and
    forming a gate structure straddling over a channel portion of each semiconductor nanowire.

2. The method of claim 1, wherein said gate structure is a sacrificial gate structure, and said method further comprises:

forming a source/drain structure on each side of said sacrificial gate structure;
removing a portion of each semiconductor pillar; and
replacing said sacrificial gate structure with a functional gate structure.

3. The method of claim 2, wherein said forming said source/drain structure comprises:
forming a doped semiconductor material on a portion of each semiconductor nanowire not protected by said sacrificial gate structure; and
diffusing dopants from said doped semiconductor material into said portion of semiconductor nanowire not protected by said sacrificial gate structure.

4. The method of claim 1, further comprising forming a local isolation region in a gap located between each semiconductor pillar.

5. The method of claim 1, wherein said forming said seed hole comprises:
providing a patterned resist having openings formed therein, said openings are located over at least a portion of each semiconductor pillar; and
performing a wet etch to provide said seed hole in said spacer.

6. The method of claim 5, wherein a sacrificial material is formed within each opening to shrink a width of each opening.

7. The method of claim 2, further comprising forming a middle-of-the-line (MOL) dielectric material after removing said portion of each semiconductor pillar and said replacing said sacrificial gate structure with said functional gate structure.

8. The method of claim 7, wherein, after replacing said sacrificial gate structure with said functional gate structure contact structure, contact structure are formed into said MOL dielectric material.

9. The method of claim 1, wherein said gate structure is a functional gate structure, and said method further comprises:
forming a source/drain structure on each side of said functional gate structure; and
removing a portion of each semiconductor pillar.

10. The method of claim 9, wherein said forming said source/drain structure comprises:
forming a doped semiconductor material on a portion of each semiconductor nanowire not protected by said functional gate structure; and
diffusing dopants from said doped semiconductor material into said portion of semiconductor nanowire not protected by said functional gate structure.

11. A semiconductor structure comprising:
a plurality of semiconductor nanowires oriented parallel to each other, wherein one end of each of said semiconductor nanowires is present in a seed hole provided in a first spacer, and another end of each of said semiconductor nanowires contacts a sidewall surface of a second spacer; and
a functional gate structure oriented perpendicular to and straddling over a channel portion of each of said semiconductor nanowires.

12. The semiconductor structure of claim 11, wherein each semiconductor nanowire of said plurality of semiconductor nanowire is located on a surface of a local isolation region.

13. The semiconductor structure of claim 12, wherein each local isolation region is spaced apart by a mesa portion of a semiconductor material.

14. The semiconductor structure of claim 13, wherein said mesa portion of said semiconductor material is an extension of a semiconductor material layer.

15. The semiconductor structure of claim 11, wherein each semiconductor nanowire comprises a III-V compound semiconductor.

16. The semiconductor structure of claim 11, further comprising a source/drain structure located on each side of said functional gate structure.

17. The semiconductor structure of claim 16, wherein each source/drain structure comprises an upper portion composed of a doped semiconductor material, and a lower portion composed of a doped portion of each of said semiconductor nanowires.

18. The semiconductor structure of claim 17, wherein said lower portion of said source/drain structure is located adjacent said channel region of said semiconductor nanowires.

19. The semiconductor structure of claim 17, further comprising a middle-of the-line (MOL) dielectric material surrounding each semiconductor nanowire and having a topmost surface that is coplanar with a topmost surface of said functional gate structure.

20. The semiconductor structure of claim 18, further comprising contact structures located within said MOL dielectric material, wherein one of said contact structures contacts a sidewall of said upper portion and said lower portion of one of said source/drain structures.

* * * * *